(12) United States Patent
Hung et al.

(10) Patent No.: US 7,088,630 B2
(45) Date of Patent: Aug. 8, 2006

(54) CIRCUIT AND METHOD FOR HIGH SPEED SENSING

(75) Inventors: Chun-Hsiung Hung, Hsinchu (TW); Su-Chueh Lo, Miaoli (TW); Shou Wei Huang, Cyonglin Township (TW)

(73) Assignee: Macronix International Co., Ltd., Hsinchu (TW)

( * ) Notice: Subject to any disclaimer, the term of this patent is extended or adjusted under 35 U.S.C. 154(b) by 190 days.

(21) Appl. No.: 10/830,813

(22) Filed: Apr. 23, 2004

(65) Prior Publication Data

US 2005/0237835 A1    Oct. 27, 2005

(51) Int. Cl.
*G11C 7/08* (2006.01)
*G11C 7/22* (2006.01)
*G11C 16/28* (2006.01)

(52) U.S. Cl. .............. 365/207; 365/205; 365/210; 365/190; 365/196; 365/185.2; 365/185.21

(58) Field of Classification Search .............. 365/207, 365/205, 185.21, 210, 185.2, 190, 196
See application file for complete search history.

(56) References Cited

U.S. PATENT DOCUMENTS

| | | | |
|---|---|---|---|
| 5,594,696 A | 1/1997 | Komarek et al. | |
| 5,684,750 A | 11/1997 | Kondoh et al. | |
| 5,999,454 A * | 12/1999 | Smith | 365/185.21 |
| 6,147,514 A | 11/2000 | Shiratake | |
| 6,215,339 B1 * | 4/2001 | Hedberg | 327/108 |
| 6,292,395 B1 | 9/2001 | Lin | |
| 6,300,816 B1 * | 10/2001 | Nguyen | 327/407 |
| 6,396,329 B1 * | 5/2002 | Zerbe | 327/336 |
| 6,480,037 B1 | 11/2002 | Song et al. | |
| 6,566,914 B1 | 5/2003 | Bruneau et al. | |
| 6,798,250 B1 * | 9/2004 | Wile | 327/51 |
| 2003/0198112 A1 | 10/2003 | Eleyan et al. | |

FOREIGN PATENT DOCUMENTS

JP    10-162578    6/1998

OTHER PUBLICATIONS

Tachibana, Suguru, et al., "A 2.6-ns Wave-Pipelined CMOS SRAM with Dual-Sensing-Latch," 1994 Symposium on VLSI Circuits Digest of Technical Papers IEEE, 1994, 2 pages.

(Continued)

*Primary Examiner*—Tuan T. Nguyen
*Assistant Examiner*—J. H. Hur
(74) *Attorney, Agent, or Firm*—Mark A. Haynes; Haynes Beffel & Wolfeld LLP

(57) ABSTRACT

A circuit and method for sensing a difference between a first signal, such as a signal from the source side of a memory cell, and a second signal, such as a signal from a reference dummy cell, includes developing first and second voltages respectively in response to the first and second signals, determining the time at which the second voltage developed in response to the second signal reaches a threshold level above a latch switching point, and latching a state of the first voltage and second voltage at the determined time using a latch circuit. The threshold level above the latch switching point is set so that potential mismatch in the components of the latch circuit is overcome prior to latching.

35 Claims, 6 Drawing Sheets

OTHER PUBLICATIONS

Suh, Jung-Won, et al, "Offset-Trimming Bit-Line Sensing Scheme for Gigabit-Scale DRAM's," IEEE J. of Solid-State Circuits 31(7), Jul. 1996, 1025-1028.

Van Noije, W.A.M., et al., "Precise Final State Determination of Mismatched CMOS Latches," IEEE J. of Solid-State Circuits 30(5), May 1995, 607-611.

Kraus, Rainer, "Analysis and Reduction of Sense-Amplifier Offset," IEEE J. of Solid-State Circuits 24(4), Aug. 1989, 1028-1033.

Huh, Yoonjong, et al., "A Study of Hot-Carrier-Induced Mismatch Drift: A Reliability Issue for VLSI Circuits," IEEE J. of Solid-State Circuits 33(6), Jun. 1998, 921-927.

Varshney, Ramesh C., et al., "Characterization of an MOS Sense Amplifier," IEEE J. of Solid-State Circuits SC-13, No. 2, Apr. 1978, 268-271.

Kawahara, Takayuki, et al., "A High-Speed, Small-Area, Threshold-Voltage-Mismatch Compensation Sense Amplifier for Gigabit-Scale DRAM Arrays," IEEE J. of Solid-State Circuits 28(7), Jul. 1993, 816-823.

Tanzawa, Toru, et al., "Design of a Sense Circuit for Low-Voltage Flash Memories," IEEE J. of Solid-State Circuits 35(10), Oct. 2000, 1415-1421.

Lovett, Simon J., et al., "Yield and Matching Implications for Static RAM Memory Array Sense-Amplifier Design," IEEE J. of Solid-State Circuits 35(8), Aug. 2000, 1200-1204.

Sarpeshkar, Rahul, et al., "Mismatch Sensitivity of a Simultaneously Latched CMOS Sense Amplifier," IEEE J. of Solid-State Circuits 26(10), Oct. 1991, 1413-1422.

* cited by examiner

CIRCUIT AND METHOD FOR HIGH SPEED SENSING

BACKGROUND OF THE INVENTION

1. Field of the Invention

The present invention relates to high speed sensing for integrated circuit memory devices; and particularly circuits and methods for limiting the effects of device mismatch in sense amplifiers.

2. Description of Related Art

Sense amplifiers in integrated circuits are often designed to detect a difference in voltage across first and second inputs. The first input is connected to a memory cell via decoding circuits that select a memory cell. If the memory cell provides a differential output, such as provided by typical SRAM memory, then the second input is coupled to the complementary output of the memory cell. If the memory cell is single ended, then the second input is coupled to a reference voltage.

Circuits that detect a difference between two inputs include latch circuits that comprise a pair of cross-coupled inverters. The inverters are designed so that the switching points are balanced to switch according to desired levels of the first and second inputs of the latch circuit. However, in the manufacturing of integrated circuits, the inverters do not match perfectly. So, the sense amplifier must be designed to account for potential mismatch. Also, the latches have relatively high switching points, so low level signals, such as signals encountered in source side sensing in memory devices, must be amplified before latching.

One way to account for potential mismatch is to provide a high gain input stage for the sense amplifier. This increases the speed of changes in voltage on the inputs to the latch circuit, so that the time required to develop the margin is short. Another way to account for mismatch is to control the timing of the latch, so that it operates to capture the state of the first and second inputs after the voltage levels on the first and second inputs have reached a stable latch point above the margin required to account for potential mismatches. See, for example, U.S. patent application Publication No. U.S. 2003/0198112 A1, entitled VARIABLE DELAY COMPENSATION FOR DATA-DEPENDENT MISMATCH IN CHARACTERISTIC OF OPPOSING DEVICES OF A SENSE AMPLIFIER, filed Apr. 16, 2002, by Eleyan et al.

The problem presented by mismatch is aggravated by the advances in clock speeds, and reductions in supply voltages in modern integrated circuits. In order for sense amplifiers to work reliably, the timing of the latch circuit must be set to allow for the mismatch margins. Because the mismatch is difficult to predict, and can vary over time, the timing must account for worst-case conditions. The timing margin to account for mismatch becomes a significant limit on increasing clock speeds for the latch circuits. Likewise, mismatch in the switching levels of latch circuits requires that they be designed with voltage headroom to account for worst-case mismatch. Thus, the voltage headroom required to account for mismatch becomes a significant limit on low voltage operation of the devices.

Also, the addition of high gain stages can aggravate the mismatch problem, because the gain stages may also suffer from mismatch. The mismatch in the high gain stage can affect the accuracy and timing of the latch stage of the sense amplifier.

Thus, it is desirable to provide a sense amplifier design that reduces the problems associated with mismatch, allowing low voltage and high-speed operation.

SUMMARY OF THE INVENTION

The present invention provides a method for sensing data, a sense amplifier and an integrated circuit incorporating one or more sense amplifiers that is adapted for low-voltage and high-speed operations. The invention is particularly adapted for use in integrated circuit memory devices, including memory devices which incorporate source side sensing.

The present invention is embodied by a method for sensing a difference between a first signal, such as a signal from the source side of a memory cell, and a second signal, such as a signal from a reference dummy cell. The method includes developing first and second voltages respectively in response to the first and second signals, determining the time at which the second voltage developed in response to the second signal reaches a threshold level above a latch switching point, and latching a state of the first voltage and second voltage at the determined time using a latch circuit. The threshold level above the latch switching point is set so that potential mismatch in the components of the latch circuit is overcome prior to latching. In this manner, any mismatch in the latch circuit does not contribute to the sensing operation. In some embodiments, the first and second voltages are developed by integrating the first and second signals.

In some embodiments of the invention, a sense timing signal is generated locally for each sense amplifier, in response to the second voltage, which causes the latching of the state of the first and second voltages. In other embodiments, a sense timing signal is generated globally for a plurality of sense amplifiers. In one embodiment, a global sense timing signal is generated by emulating the operation of the sense amplifiers, for example by providing a dummy sense amplifier which develops a dummy second voltage in a manner that emulates operation of the sense amplifiers used for sensing data.

The present invention is also embodied by an integrated circuit including one or more sense amplifiers which sense a difference across respective first and second signal terminals. The sense amplifier comprises a latch circuit having a first input, a second input and a sense enable input. The latch has a latch switching point on the second input and a latch switching point on the first input, which may exhibit mismatch. The sense amplifier also includes input stage coupled to the first and second signal terminals, and having outputs coupled to the first input and the second input of the latch circuit. The input stage develops a voltage on the first input in response to signal on the first signal terminal, and a voltage on the second input in response to a signal on the second signal terminal. In some embodiments of the invention, the input stage comprises first and second matched integrators. A source for a sense timing signal which is coupled to the sense enable input of the latch is also provided. The sense timing signal is generated so that the latch circuit latches the state of the first and second inputs when the voltage developed on the second input has reached a threshold level above the latch switching point.

According to some embodiments, the source of the sense timing signal comprises a level detector coupled to the second input of the latch circuit in the sense amplifier, which indicates when the second input locally exceeds a predetermined threshold level. In yet another embodiments, the source of the sense timing signal provides the sense timing signal globally for a plurality of sense amplifiers, such as by implementing a dummy sense amplifier and detecting the level of a node emulating the second input of the latch circuit.

In yet another embodiments of the present invention, the integrated circuit comprises a non-volatile memory adapted for source side sensing.

An embodiment of the input stage and latch circuit of the sense amplifier is provided in which potential mismatch between only two transistors effects operation of the sense amplifier. According to this embodiment, the sense amplifier comprises a current source;

a switch coupled to the current source, and providing a first current output and a second current output in response to a sense timing signal and wherein the input stage comprises a first integrator and a second integrator, and the first integrator comprises:

a first p-channel MOS transistor having a source coupled to the first current output, a gate coupled to the first signal terminal, and a drain coupled to the first input of the latch circuit;

a first n-channel MOS transistor having a drain coupled to the first input of the latch circuit, a gate coupled to a reference voltage, and a source couple to a ground reference; and the second integrator comprises a second p-channel MOS transistor having a source couple to the second current output, a gate coupled to the second signal terminal, and a drain coupled to the second input of the latch circuit;

a first n-channel MOS transistor having a drain coupled to the second input of the latch circuit, a gate coupled to the reference voltage, and a source couple to the ground reference; and wherein the latch circuit comprises:

a first p-channel MOS transistor and a first n-channel MOS transistor arranged as a first inverter, wherein the source of the first p-channel transistor is coupled to a supply node, and the source of the first n-channel transistor is coupled to a reference node;

a second p-channel MOS transistor and a second n-channel MOS transistor arranged as a second inverter, cross coupled with the first inverter, wherein the source of the second p-channel transistor is coupled to the supply node, and the source of the second n-channel transistor is coupled to the reference node;

a third p-channel transistor, having a drain coupled to the supply node, a source coupled to a supply voltage source, and a gate coupled to the sense timing signal; and a third n-channel transistor, having a drain coupled to the reference node, a source coupled to a reference voltage source, and a gate coupled to the sense timing signal.

According to this embodiment, any potential mismatch between transistors in the latch circuit does not affect operation of the device. Rather, the only mismatch to be accounted for in operation is any potential mismatch between the first p-channel MOS transistors in the first and second integrators.

The present invention provides a sense amplifier circuit operable with high speeds and low powers, where timing margins required to account for mismatch in the latch circuit of the sense amplifier are substantially eliminated. Furthermore, the sense amplifier is operable with swings on the first signal terminal characteristic of source side sensing, such as very small voltage variations between for example about zero and 100 millivolts.

Other aspects and advantages of the present invention can be seen on review of the drawings, the detailed description and the claims, which follow.

DETAILED DESCRIPTION

Representative prior art is described with reference to FIG. 1, and FIGS. 2A–2B. A detailed description of embodiments of the present invention is provided with reference to FIGS. 3–7.

Figure 1:
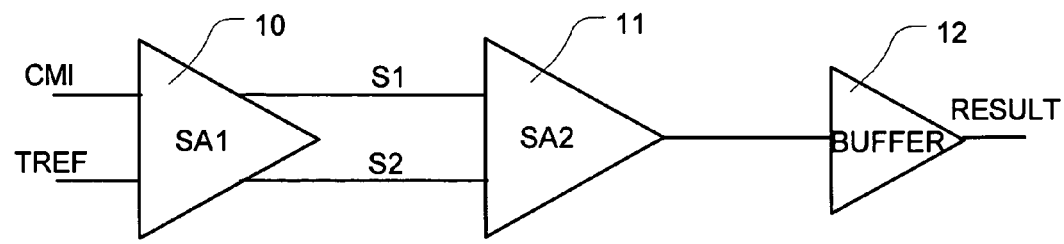
FIG. 1 is a simplified diagram of a two-stage sense amplifier according to the prior art.

One prior art approach to sense amplifiers for the small signals, such as signals generated in a source sensing memory device, is shown in FIG. 1. In the prior art embodiment of FIG. 1, two amplifying stages are utilized. The first amplifying stage 10 is connected to receive a signal CMI from the source side of a memory cell and a signal TREF from a reference cell. The first amplifying stage generates differential outputs S1 and S2, which are connected as inputs to the second amplifying stage 11. The second amplifying stage 11 generates a single ended output, which is typically coupled to a buffer 12 that drives the output signal.

Figure 2A:
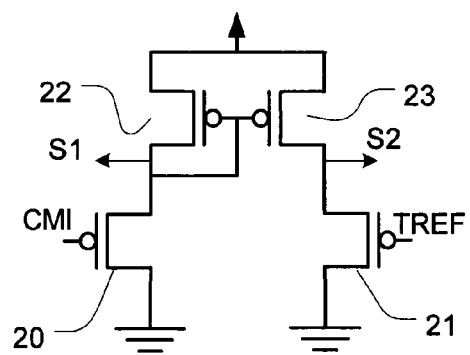
FIGS. 2A–2B illustrate prior art implementations of a first stage sense amplifier and second stage sense amplifier, respectively, suitable for configuration as shown in FIG. 1.
Figure 2B:
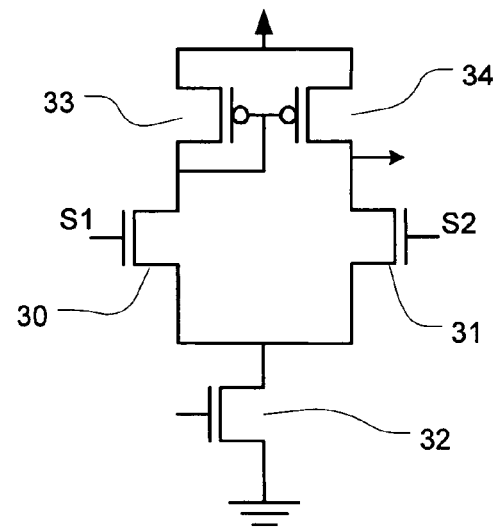

One embodiment of the first amplifying stage is shown in FIG. 2A. The embodiment shown in FIG. 2A comprises a differential amplifier with an active load current mirror. The low voltage signals CMI and TREF are applied as inputs to matching p-channel transistors 20, 21, which have their drains coupled to ground and their sources coupled to the output nodes S1 and S2. A current mirror composed of p-channel transistors 22, 23, having their sources coupled to a supply voltage, their gates coupled together and to the source of transistor 20, and their drains coupled to the output nodes S1, S2, provides an active load. The difference between the low voltage signals CMI and TREF is amplified and delivered as signals SI and S2 to the second stage amplifier.

One embodiment of the second amplifying stage is shown in FIG. 2B, which comprises again a differential amplifier with an active load current mirror. The differential amplifier with active load current mirror of FIG. 2B accepts the amplified signals S1 and S2 on the gates of matching n-channel transistors 30, 31. The sources of the n-channel transistors 30, 31 are coupled to the drain of current source transistor 32. The drains of n-channel transistors 30, 31 are coupled to the current mirror composed of p-channel transistors 33, 34, having their sources coupled to a supply voltage, their gates coupled together and to the source of transistor 30, and their drains coupled to the drains of n-channel transistors 30, 31. The output of the second stage is provided at the drain of n-channel transistor 31 as a single ended, logical level signal which indicates the state of the voltages CMI and TREF.

Problems arise in the prior art embodiment described above due to mismatch of the transistors in the first and second amplifying stages. Any difference in the threshold voltages for example of the transistors 20 and 21, results in instability of the amplifier as the voltages cross through the range of voltages including the switching point of transistor 20 and the switching point of transistor 21. The speed of operation of the sense amplifier suffers because of the requirement that the voltage fluctuations caused during transitions through the unstable range settle. The second stage amplifier also will have an unstable range around the switching points of transistors 30 and 31. These mismatch instabilities stack together, and result in significant range of unstable operation of the sense amplifier. In addition, the use of active load current mirrors and two amplifying stages consumes in significant current, and takes up significant area on the integrated circuit.

Figure 3:
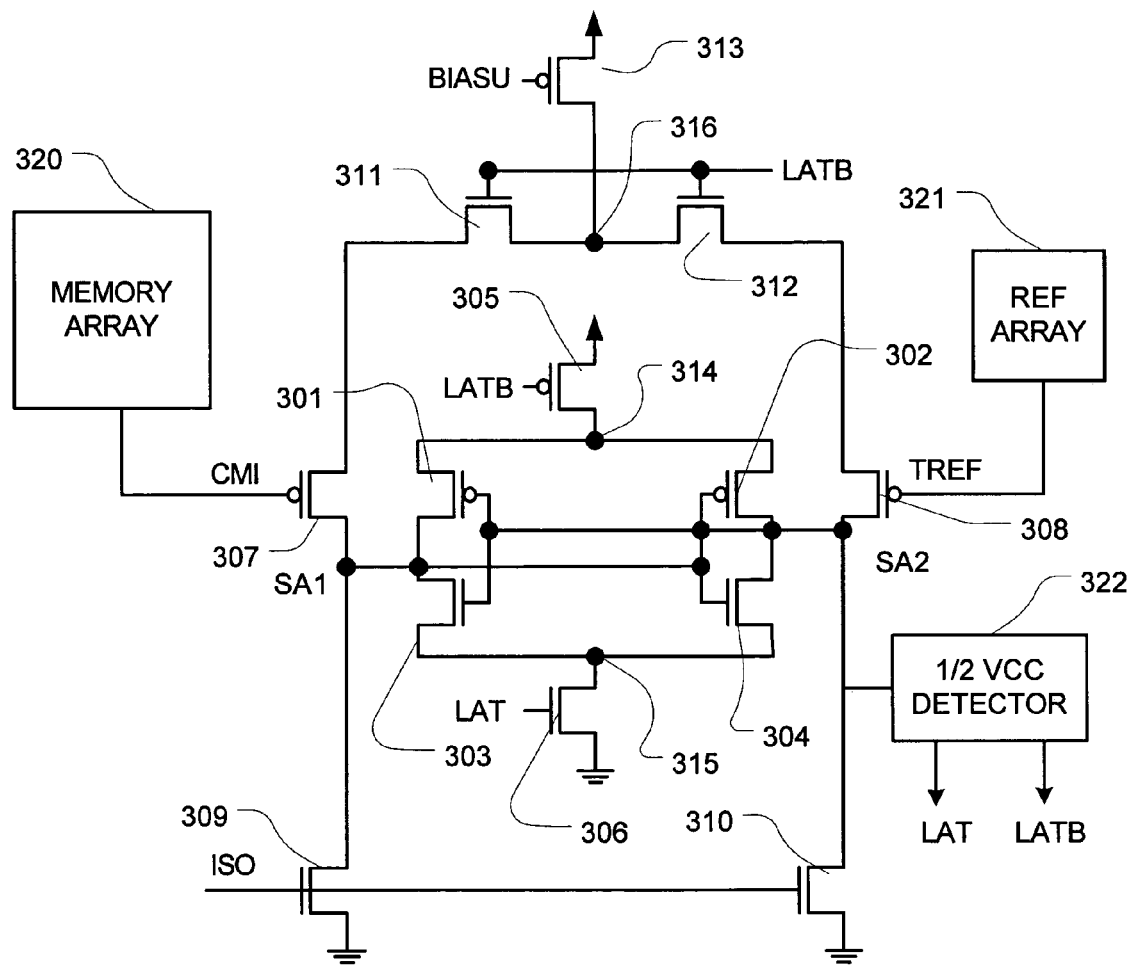
FIG. 3 is a schematic diagram of a sense amplifier according to the present invention.

FIG. 3 illustrates an embodiment of the present invention which substantially reduces mismatch instabilities in a sense amplifier, and conserves space and power on an integrated circuit. The sense amplifier comprises a latch circuit composed of transistors 301–306, and an input stage composed of transistors 307–313. In the latch circuit, p-channel transistor 301 and n-channel transistor 303 are configured as an inverter between a supply node 314 and a reference node 315. Likewise, p-channel transistor 302 and n-channel transistor 304 are configured as an inverter between the supply node 314 and a reference node 315. The inverter composed of p-channel transistor 301 and n-channel transistor 303 is cross-coupled with the inverter composed of p-channel transistor 302 and n-channel transistor 304 in a standard latch circuit configuration. The supply node 314 is coupled through p-channel transistor 305 to a supply terminal. The reference node 315 is coupled through n-channel transistor 306 to a ground supply node. The gates of the transistors 305 and 306 are coupled to receive the complementary signals LATB and LAT, respectively, which act as a sense timing signal enabling the latch circuit to latch the state of the voltages on its inputs SA1 and SA2.

In the input stage, p-channel transistors 307 and 308 are configured to act as integrators to develop respective voltages on the inputs SA1 and SA2 of the latch circuit. The input stage includes p-channel transistor 313 having its source coupled to the supply node, its gate coupled to a reference signal BIASU to control bias current for the integrator. The drain of transistor 313 is coupled to the node 316. N-channel transistor 311 is coupled between the node 316 and the source of p-channel transistor 307. The drain of p-channel transistor 307 is coupled to the first input SA1 of the latch circuit. The gate of the p-channel transistor 307 is coupled to a signal source that provides the CMI signal from the source side of a memory cell in memory array 320. The drain of the p-channel transistor 307 is also coupled to the drain of n-channel transistor 309, which has its gate coupled to a bias signal ISO, and its source coupled to a ground node.

N-channel transistor 312 is coupled between the node 316 and the source of p-channel transistor 308. The drain of p-channel transistor 308 is coupled to the second input SA2 of the latch circuit. The gate of the p-channel transistor 308 is coupled to a signal source that provides the TREF signal from the source side of a memory cell in reference array 321. The drain of the p-channel transistor 308 is also coupled to the drain of n-channel transistor 310, which has its gate coupled to the bias signal ISO, and its source coupled to a ground node.

The sense timing signal including LAT and LATB is generated in this embodiment by a threshold detector 322, which is set to detect the level of the voltage developed on the second input SA2 of the latch circuit. In the example shown, the threshold detector 322 is set to detect one half of the supply potential, or another predetermined threshold level. The threshold detector 322 can be set to any appropriate level, above the switching point of transistor 308, such as for example between about 0.7 volts and the supply potential in a typical embodiment.

In operation, while LATB is high, signals from the source side of the memory cell and the reference cell are provided on the gates of transistors 307 and 308 of the input stage, which start to integrate the signals to provide respective voltages on the inputs SA1 and SA2 of the latch circuit. After the voltage on the input SA2 reaches the threshold level above the switching point of the latch circuit, the sense timing signal LAT goes high and LATB goes low. This causes the latch circuit to latch the state of the voltages on the input nodes SA1 and SA2, and to develop a logical level signal. According to this method of operation, the mismatch issue only affects the operation of transistors 307 and 308. The latch circuit operates fast and with controlled timing, latching voltages developed on the inputs when they are out of the unstable range caused by mismatch in the latch circuit.

Figure 4:
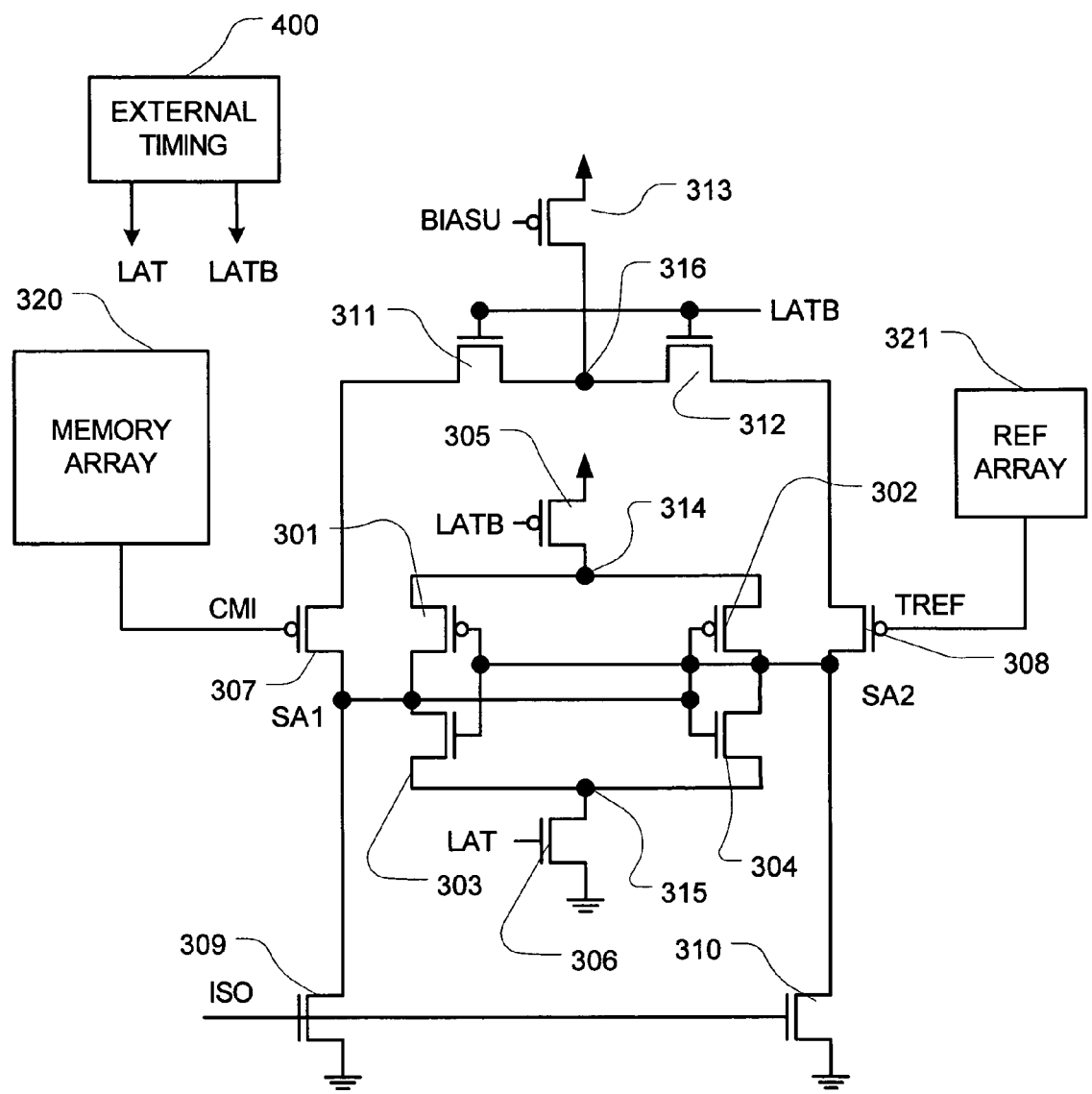
FIG. 4 is a schematic diagram of an alternative sense amplifier according to the present invention.

In the embodiment described with reference to FIG. 3, the sense timing signals LAT and LATB are generated locally at the sense amplifier. In an alternative embodiment, as shown in FIG. 4, the sense timing signals LAT and LATB are generated by the external timing circuit 400, implemented by circuits that are not local to the sense amplifier, but are preferably on the same integrated circuit. The input stage and latch circuit are implemented in the same manner, and the same reference numerals are used for like components, as the sense amplifier of FIG. 3. The externally generated LAT and LATB signals may be applied to a plurality of sense amplifiers. By implementing the external timing circuit 400, area of the sense amplifiers is reduced.

Figure 5:
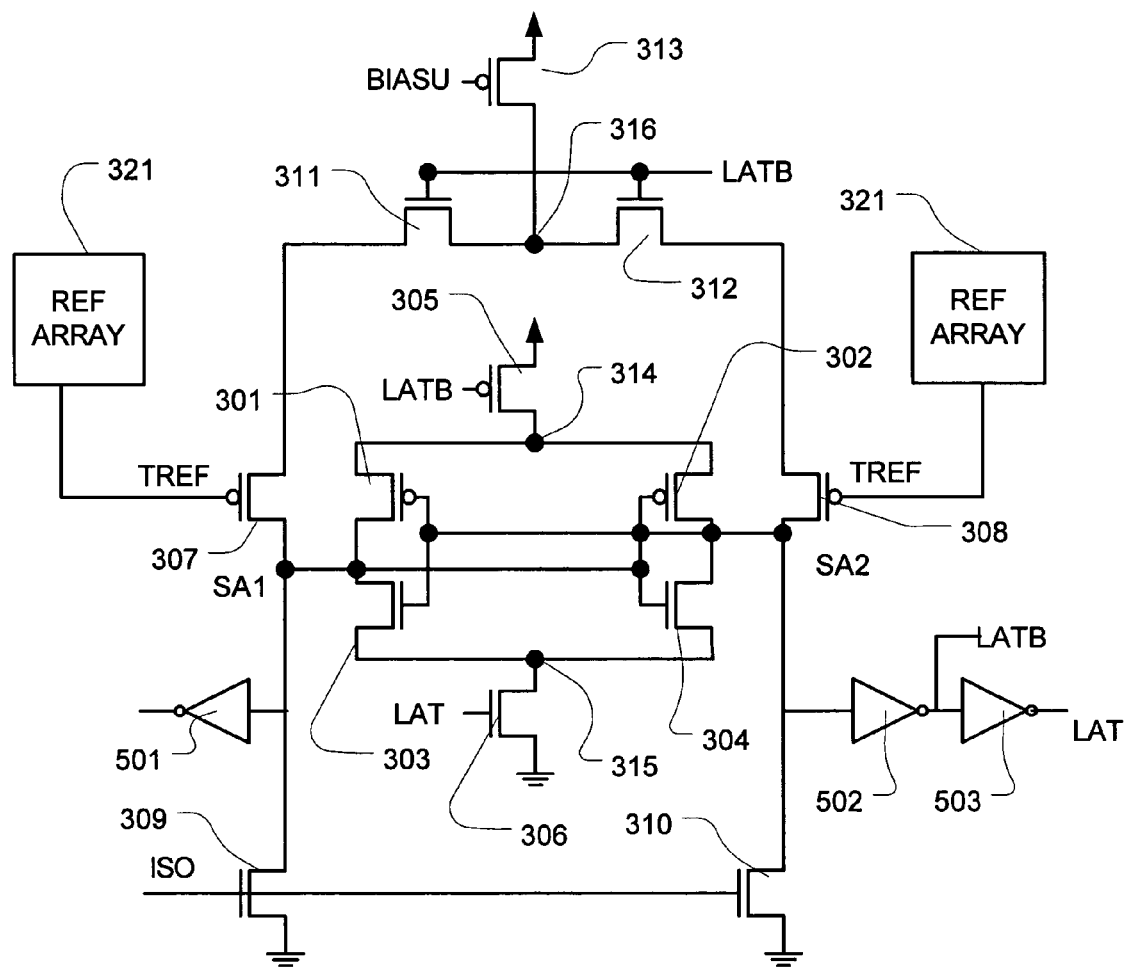
FIG. 5 is a schematic diagram of an external timing circuit suitable for generation of a sense timing signal for embodiments of the present invention.

FIG. 5 illustrates one embodiment of an external timing circuit 400, which is configured as a dummy sense amplifier to emulate the operation of the actual sense amplifiers for which the sense timing signals are being generated. As can be seen, the dummy sense amplifier includes the input stage and latch circuit configured in the same manner as the sense amplifier of FIG. 3, and the same reference numerals are used on corresponding components. However, the gates of p-channel transistors 307 and 308 are both coupled to TREF signals generated in the reference array 321. The signal BIASU is low during operation, while the signal ISO is also low. Also, the p-channel transistor 305 has its gate tied high, while n-channel transistor 306 has its gate tied low to turn off the latch circuit. An inverter 501 is coupled to the input SA1, acting as a dummy load. A threshold detector is implemented by inverters 502 and 503 connected in series, which generate the LATB and LAT signals, respectively, after the voltage developed on the node SA2 reaches a level above the switching point of the inverter 502. The switching point of the inverter 502 is designed to be one half of the supply potential, or such other voltage level and suits the particular embodiment.

Figure 6:
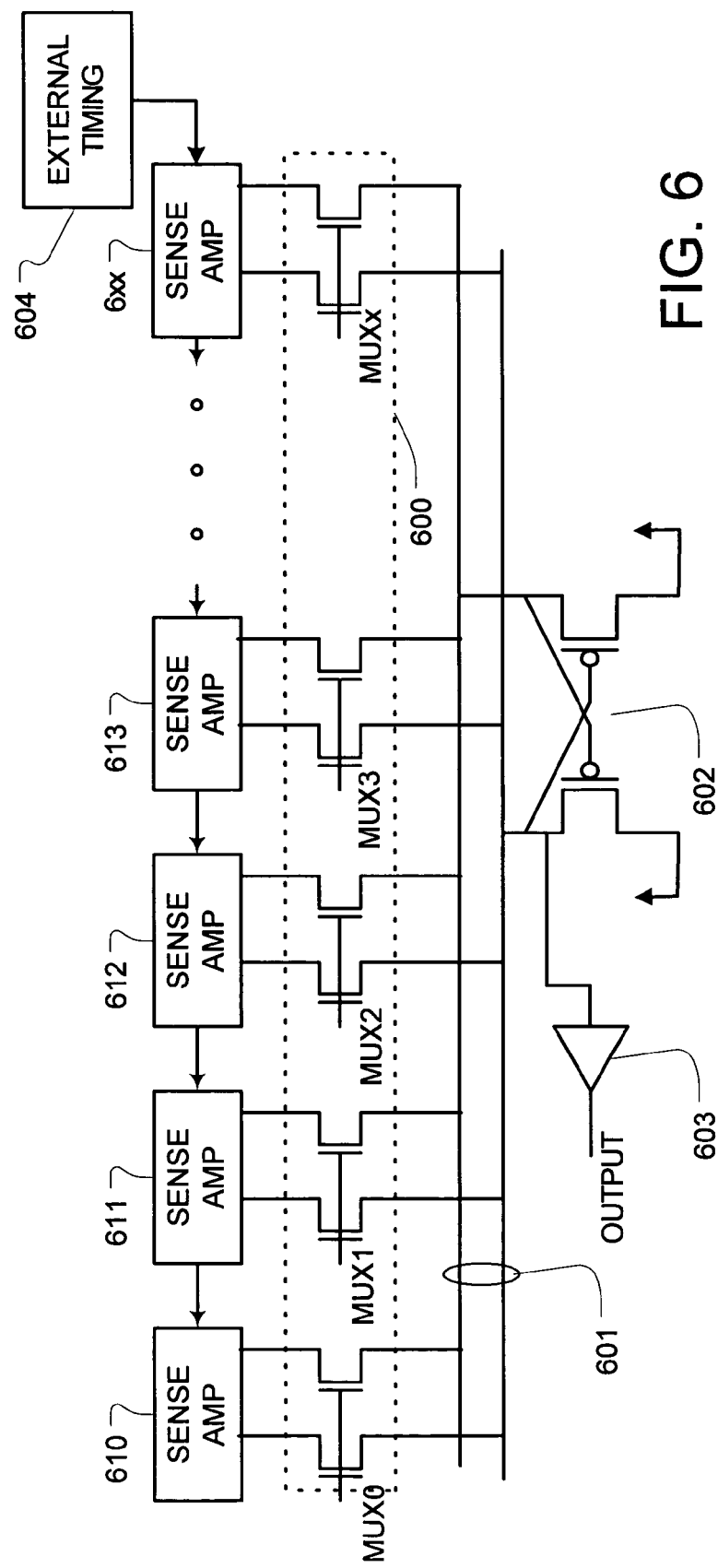
FIG. 6 is a simplified diagram of a configuration of sense amplifiers in a page mode device according to embodiments of the present invention.

FIG. 6 illustrates an extension of the present invention to page mode operation. In integrated circuit memory devices having a page mode, sense amplifiers are provided on a large number of bit lines. The small size and low power consumption of the sense amplifier of the present invention makes it suitable for page mode operation. In the embodiment illustrated in FIG. 6, the true and complement outputs SA1 and SA2 of the sense amplifiers 610, 611, 612, 613, 6xx, are coupled to a multiplexer 600 for connecting the sensed signals to an output bus 601. Cross-coupled p-channel transistors 602 play the role of the latch for the result of the sense amplifiers. The output is provided through an output buffer 603 according to well-known output decoding techniques. Timing control is provided by the external timing circuit 604, which supplies a sense timing signal and distributes it to the plurality of sense amplifiers. The external timing circuit 604 can be manufactured so that it drives all the sense amplifiers on the integrated circuit. In an alternative embodiment, a plurality of external timing circuits are provided on the device, each supplying sense timing signals to a subset of the sense amplifiers on the device most closely matched to the timing circuits.

Figure 7:
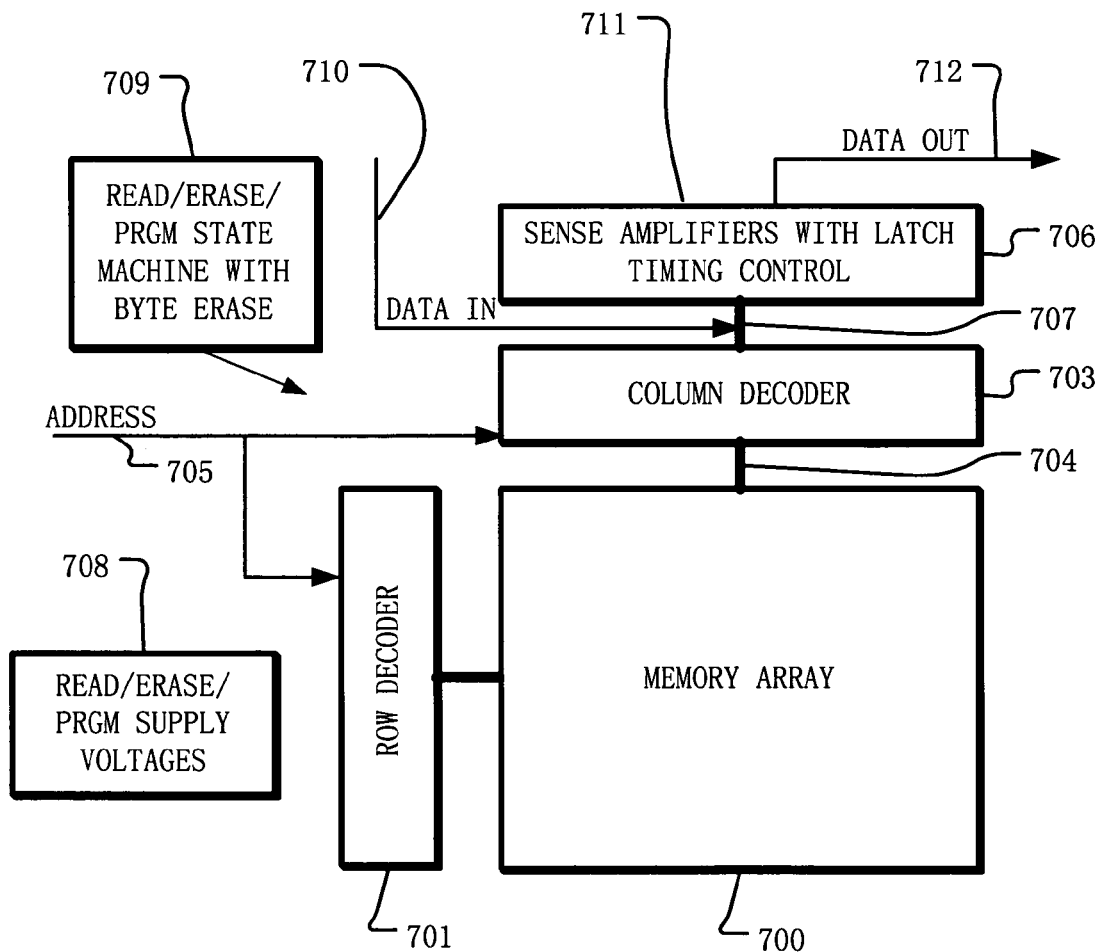
FIG. 7 is a simplified block diagram of an integrated circuit according to the present invention.

FIG. 7 is a simplified block diagram of an integrated circuit having sense amplifiers with latch timing control according to the present invention. The integrated circuit includes a memory array 700 implemented using for example but not limited to, ROM, flash EPROM, or NROM memory cells, and preferably supporting source-side sensing. A row decoder 701 is coupled to a plurality of word lines 702 arranged along rows in the memory array 700. A column decoder 703 is coupled to a plurality of bit lines 704 arranged along columns in the memory array 700. Addresses are supplied on bus 705 to column decoder 703 and row decoder 701. Sense amplifiers which include an input stage the develops voltages on the input of a latch circuit in response to signals being sensed, with controlled latch timing as described above to ensure operation of the latch circuit at logical levels and in stable regions, are provided in block 706, and coupled to the column decoder 703 via data bus 707. In writable embodiments, data is supplied via the data-in line 711 from input/output ports on the integrated circuit to the data-in structures (not shown). Data is supplied via the data out line 712 from the sense amplifiers in block 706 to input/output ports on the integrated circuit.

In some embodiments, resources for controlling the reading, programming and erasing of memory cells in the array 700 are included on the chip. These resources include read/erase/program supply voltage sources represented by block 708, and the state machine 709, which are coupled to the array 700, the decoders 701, 703 and other circuitry on the integrated circuit, which participates in operation of the device.

The supply voltage sources 708 are implemented in various embodiments using charge pumps, voltage regulators, voltage dividers and the like as known in the art, for supplying various voltage levels, including negative voltages, used in the read, erase and program operations.

The state machine 709 supports read, erase and program operations. The state machine 711 can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the state machine.

In summary, the present invention provides a sense amplifier suitable for small signal operation, such as source sensing memory devices, with reduced exposure to mismatch. The sense amplifier may be operated at high speeds, with simple timing control. The sense amplifier consumes less power and less space than prior art systems.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for sensing a difference between a first signal and a second signal, comprising:
   developing first and second voltages in response to the first and second signals;
   determining a time at which the second voltage has reached a threshold level above a latch switching point for a latch circuit accounting for potential mismatch in the latch circuit; and
   latching a state of the first and second voltages at the determined time using the latch circuit.

2. The method of claim 1, wherein said developing includes integrating the first and second signals to supply the first and second voltages on respective first and second latch inputs on the latch circuit.

3. The method of claim 1, wherein a first signal input receives the first signal, the first signal input is coupled to a memory cell, a second signal input receives the second signal, and the second signal input is coupled to a dummy cell.

4. The method of claim 1, wherein a first signal input receives the first signal, the first signal input is coupled to a memory cell, a second signal input receives the second signal, and the second signal input is coupled to a dummy cell; and
   generating a sense timing signal by detecting when the second voltage reaches the threshold level.

5. The method of claim 1, including generating a sense timing signal by detecting when the second voltage reaches the threshold level.

6. The method of claim 1, including generating a sense timing signal by dynamically determining when the second voltage exceeds the threshold level.

7. The method of claim 1, including providing a dummy sense amplifier which operates by integrating first and second dummy inputs to produce first and second dummy voltages, and generating the sense timing signal by detecting when the second dummy voltage reaches a predetermined threshold level.

8. The method of claim 1, wherein said first signal is coupled to a source side of a memory cell in a non-volatile memory and the second signal is provided by a reference circuit.

9. The method of claim 1, wherein said first signal is coupled to a source side of a memory cell in a non-volatile memory and the second signal is provided by a dummy memory cell.

10. An integrated circuit including one or more sense amplifiers, the one or more sense amplifiers sensing a difference across respective first and second signal terminals, the sense amplifier comprising:
    a latch circuit, having a first input and a second input and a latch switching point, and having a sense enable input, which captures a state of the first and second inputs in response to a sense timing signal on the sense enable input;

an input stage coupled to the first and second signal terminals, and having outputs coupled to the first input and the second input of the latch circuit, the input stage developing a voltage on the first input in response to a signal on the first signal terminal, and a voltage on the second input in response to a signal on the second signal terminal; and a source for the sense timing signal coupled to the sense enable input, causing the latch circuit to latch the state of the first and second inputs after the voltage developed on one of the first and second inputs reaches a threshold level above the latch switching point.

11. The integrated circuit of claim 10, wherein the input stage comprises:
a first integrator coupled to the first signal terminal, having an output coupled to the first input of the latch circuit;
a second integrator coupled to the second signal terminal, having an output coupled to the second input of the latch circuit.

12. The integrated circuit of claim 10, wherein the first signal input is coupled to a memory cell, and including a dummy cell coupled to the second signal input.

13. The integrated circuit of claim 10, wherein the first signal input is coupled to a memory cell, and including a dummy cell coupled to the second signal input; and
wherein said source of the sense timing signal comprises a level detector coupled to the second input, which indicates when the second input exceeds the threshold level above the latch switching point for the latch circuit.

14. The integrated circuit of claim 10, wherein said source of the sense timing signal comprises a level detector coupled to the second input, which indicates when the second input exceeds the threshold level above the latch switching point for the latch circuit.

15. The integrated circuit of claim 10, wherein said source of the sense timing signal dynamically determines when the second input exceeds the threshold level above the latch switching point for the latch circuit.

16. The integrated circuit of claim 10, wherein said integrated circuit comprises a plurality of said sense amplifiers, and the source of the sense timing signal drives the sense timing signal for said plurality of sense amplifiers.

17. The integrated circuit of claim 10, wherein said integrated circuit comprises a plurality of said sense amplifiers, and the source of the sense timing signal drives the sense timing signal for said plurality of sense amplifiers, and comprises dummy sense amplifier emulating the sense amplifiers in the plurality of sense amplifiers, including a level detector coupled to a node emulating the voltage on the second input.

18. The integrated circuit of claim 10, wherein said integrated circuit comprises a non-volatile memory and a plurality of said sense amplifiers coupled to said non-volatile memory.

19. The integrated circuit of claim 10, wherein said integrated circuit comprises a non-volatile memory and a plurality of said sense amplifiers coupled to said non-volatile memory, and wherein said first signal terminal is coupled to a source side of a memory cell in the non-volatile memory.

20. The integrated circuit of claim 10, including
a current source;

a switch coupled to the current source, and providing a first current output and a second current output in response to a sense timing signal and wherein the input stage comprises a first integrator and a second integrator, and the first integrator comprises:
a first p-channel MOS transistor having a source couple to the first current output, a gate coupled to the first signal terminal, and a drain coupled to the first input of the latch circuit;
a first n-channel MOS transistor having a drain coupled to the first input of the latch circuit, a gate coupled to a reference voltage, and a source couple to a ground reference; and the second integrator comprises
a second p-channel MOS transistor having a source couple to the second current output, a gate coupled to the second signal terminal, and a drain coupled to the second input of the latch circuit;
a first n-channel MOS transistor having a drain coupled to the second input of the latch circuit, a gate coupled to the reference voltage, and a source couple to the ground reference.

21. The integrated circuit of claim 10, wherein the latch circuit comprises:
a first p-channel MOS transistor and a first n-channel MOS transistor arranged as a first inverter;
a second p-channel MOS transistor and a second n-channel MOS transistor arranged as a second inverter, cross coupled with the first inverter.

22. The integrated circuit of claim 10, wherein the latch circuit comprises:
a first p-channel MOS transistor and a first n-channel MOS transistor arranged as a first inverter, wherein the source of the first p-channel transistor is coupled to a supply node, and the source of the first n-channel transistor is coupled to a reference node;
a second p-channel MOS transistor and a second n-channel MOS transistor arranged as a second inverter, cross coupled with the first inverter, wherein the source of the second p-channel transistor is coupled to the supply node, and the source of the second n-channel transistor is coupled to the reference node;
a third p-channel transistor, having a drain coupled to the supply node, a source coupled to a supply voltage source, and a gate coupled to the sense timing signal; and
a third n-channel transistor, having a drain coupled to the reference node, a source coupled to a reference voltage source, and a gate coupled to the sense timing signal.

23. The integrated circuit of claim 10, including
a current source;
a switch coupled to the current source, and providing a first current output and a second current output in response to a sense timing signal and wherein the input stage comprises a first integrator and a second integrator, and the first integrator comprises:
a first p-channel MOS transistor having a source couple to the first current output, a gate coupled to the first signal terminal, and a drain coupled to the first input of the latch circuit;
a first n-channel MOS transistor having a drain coupled to the first input of the latch circuit, a gate coupled to a reference voltage, and a source couple to a ground reference; and the second integrator comprises a second p-channel MOS transistor having a source couple to the second current output, a gate coupled to the second signal terminal, and a drain coupled to the second input of the latch circuit;

a first n-channel MOS transistor having a drain coupled to the second input of the latch circuit, a gate coupled to the reference voltage, and a source couple to the ground reference; and wherein the latch circuit comprises:

a first p-channel MOS transistor and a first n-channel MOS transistor arranged as a first inverter, wherein the source of the first p-channel transistor is coupled to a supply node, and the source of the first n-channel transistor is coupled to a reference node;

a second p-channel MOS transistor and a second n-channel MOS transistor arranged as a second inverter, cross coupled with the first inverter, wherein the source of the second p-channel transistor is coupled to the supply node, and the source of the second n-channel transistor is coupled to the reference node;

a third p-channel transistor, having a drain coupled to the supply node, a source coupled to a supply voltage source, and a gate coupled to the sense timing signal; and a third n-channel transistor, having a drain coupled to the reference node, a source coupled to a reference voltage source, and a gate coupled to the sense timing signal.

24. An integrated circuit, comprising:

a memory array including decoding circuitry to select a plurality of memory cells for output;

a reference array; and a plurality of sense amplifiers, coupled to the plurality of memory cells and to the reference array; the sense amplifiers in the plurality of sense amplifiers including:

a latch circuit, having a first input and a second input and a latch switching point, and having a sense enable input, which captures a state of the first and second inputs in response to a sense timing signal on the sense enable input;

a first integrator coupled to a corresponding one of the plurality of memory cells, having an output coupled to the first input of the latch circuit;

a second integrator coupled to the reference array, having an output coupled to the second input of the latch circuit; and a source for the sense timing signal coupled to the sense enable inputs of the plurality of sense amplifiers, causing the latch circuits to latch the states of the first and second inputs after the output of one of the first and second integrators has reached a threshold level above the latch switching point.

25. The integrated circuit of claim 24, wherein the source for the sense timing signal comprises a level detector in each of said plurality of sense amplifiers, coupled to the second input of the latch circuit.

26. The integrated circuit of claim 24, the source of the sense timing signal comprises a dummy sense amplifier emulating the sense amplifiers in the plurality of sense amplifiers, including a level detector coupled to a node emulating the second input of the latch circuit, which indicates when the output of the second integrator in the dummy sense amplifier exceeds a predetermined threshold level.

27. The integrated circuit of claim 24, wherein said source of the sense timing signal dynamically determines when the output of the second integrator exceeds the threshold level.

28. The integrated circuit of claim 24, wherein said memory array comprises a non-volatile memory array.

29. The integrated circuit of claim 24, wherein said memory array comprises a non-volatile memory array, and wherein said first signal terminal is coupled to a source side of a memory cell in the non-volatile memory.

30. The integrated circuit of claim 24, wherein said memory array comprises a non-volatile NROM memory array, and wherein said first signal terminal is coupled to a source side of a memory cell in the non-volatile memory.

31. The integrated circuit of claim 24, wherein said sense amplifiers in the plurality of sense amplifiers include a current source;

a switch coupled to the current source, and providing a first current output and a second current output in response to the sense timing signal and wherein the first integrator comprises:

a first p-channel MOS transistor having a source couple to the first current output, a gate coupled to the first signal terminal, and a drain coupled to the first input of the latch circuit;

a first n-channel MOS transistor having a drain coupled to the first input of the latch circuit, a gate coupled to a reference voltage, and a source couple to a ground reference; and the second integrator comprises a second p-channel MOS transistor having a source couple to the second current output, a gate coupled to the second signal terminal, and a drain coupled to the second input of the latch circuit;

a first n-channel MOS transistor having a drain coupled to the second input of the latch circuit, a gate coupled to the reference voltage, and a source couple to the ground reference.

32. The integrated circuit of claim 24, wherein the latch circuit in said sense amplifiers in the plurality of sense amplifiers comprises:

a first p-channel MOS transistor and a first n-channel MOS transistor arranged as a first inverter;

a second p-channel MOS transistor and a second n-channel MOS transistor arranged as a second inverter, cross coupled with the first inverter.

33. The integrated circuit of claim 24, wherein the latch circuit in said sense amplifiers in the plurality of sense amplifiers comprises:

a first p-channel MOS transistor and a first n-channel MOS transistor arranged as a first inverter, wherein the source of the first p-channel transistor is coupled to a supply node, and the source of the first n-channel transistor is coupled to a reference node;

a second p-channel MOS transistor and a second n-channel MOS transistor arranged as a second inverter, cross coupled with the first inverter, wherein the source of the second p-channel transistor is coupled to the supply node, and the source of the second n-channel transistor is coupled to the reference node;

a third p-channel transistor, having a drain coupled to the supply node, a source coupled to a supply voltage source, and a gate coupled to the sense timing signal; and a third n-channel transistor, having a drain coupled to the reference node, a source coupled to a reference voltage source, and a gate coupled to the sense timing signal.

34. The integrated circuit of claim 24, wherein the sense amplifiers in said plurality of sense amplifiers include a current source;

a switch coupled to the current source, and providing a
   first current output and a second current output in
   response to a sense timing signal and wherein
the first integrator comprises:
a first p-channel MOS transistor having a source couple to
   the first current output, a gate coupled to the first signal
   terminal, and a drain coupled to the first input of the
   latch circuit;
a first n-channel MOS transistor having a drain coupled to
   the first input of the latch circuit, a gate coupled to a
   reference voltage, and a source couple to a ground
   reference; and
the second integrator comprises
a second p-channel MOS transistor having a source
   couple to the second current output, a gate coupled to
   the second signal terminal, and a drain coupled to the
   second input of the latch circuit;
a first n-channel MOS transistor having a drain coupled to
   the second input of the latch circuit, a gate coupled to
   the reference voltage, and a source couple to the ground
   reference; and wherein
the latch circuit comprises:

a first p-channel MOS transistor and a first n-channel
   MOS transistor arranged as a first inverter, wherein the
   source of the first p-channel transistor is coupled to a
   supply node, and the source of the first n-channel
   transistor is coupled to a reference node;
a second p-channel MOS transistor and a second n-channel MOS transistor arranged as a second inverter, cross
   coupled with the first inverter, wherein the source of the
   second p-channel transistor is coupled to the supply
   node, and the source of the second n-channel transistor
   is coupled to the reference node;
a third p-channel transistor, having a drain coupled to the
   supply node, a source coupled to a supply voltage
   source, and a gate coupled to the sense timing signal;
   and
a third n-channel transistor, having a drain coupled to the
   reference node, a source coupled to a reference voltage
   source, and a gate coupled to the sense timing signal.

35. The integrated circuit of claim 24, wherein the memory comprises a page mode memory.

* * * * *